United States Patent
Wang et al.

(10) Patent No.: US 10,983,600 B2
(45) Date of Patent: Apr. 20, 2021

(54) ELECTRONIC DEVICES WITH FABRIC BUTTONS

(71) Applicant: Apple Inc., Cupertino, CA (US)

(72) Inventors: Paul X. Wang, Cupertino, CA (US);
Ian A. Guy, Santa Cruz, CA (US);
Karan Bir, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/539,754

(22) Filed: Aug. 13, 2019

(65) Prior Publication Data

US 2021/0048894 A1     Feb. 18, 2021

(51) Int. Cl.
| | |
|---|---|
| G09G 5/00 | (2006.01) |
| G06F 3/02 | (2006.01) |
| G06F 3/01 | (2006.01) |
| F21V 8/00 | (2006.01) |
| H03K 17/96 | (2006.01) |

(52) U.S. Cl.
CPC .......... G06F 3/0202 (2013.01); G02B 6/001 (2013.01); G06F 3/016 (2013.01); H03K 17/962 (2013.01); *H03K 2217/96062* (2013.01); *H03K 2217/96076* (2013.01); *H03K 2217/96079* (2013.01)

(58) Field of Classification Search
CPC ...... G06F 3/025; G06F 3/0202; G06F 1/1662; G06F 1/1666; G09G 5/00; H01H 13/14; H01H 13/70; H01H 13/705
See application file for complete search history.

(56) References Cited

U.S. PATENT DOCUMENTS

| | | | | |
|---|---|---|---|---|
| 3,958,307 | A  * | 5/1976 | Ishizaki | ................... A44B 1/30 24/108 |
| 9,282,893 | B2 | 3/2016 | Longinotti-Buitoni et al. | |
| 9,588,551 | B1 * | 3/2017 | Hegde | ............... B29C 45/14786 |
| 9,997,305 | B2 * | 6/2018 | Wang | ...................... H01H 13/14 |
| 10,081,887 | B2 | 9/2018 | Manipatruni et al. | |
| 10,156,029 | B1 * | 12/2018 | Podhajny | ............ G06F 3/04883 |
| 10,276,326 | B1 * | 4/2019 | Wang | ...................... H02J 50/10 |
| 10,514,772 | B1 * | 12/2019 | Wang | ................. H03K 17/9622 |
| 10,566,151 | B1 * | 2/2020 | Wang | ...................... H01H 13/52 |
| 10,590,600 | B1 * | 3/2020 | Wang | ...................... H01H 13/83 |
| 10,635,186 | B1 * | 4/2020 | Wang | ................. H03K 17/9622 |

(Continued)

*Primary Examiner* — Joe H Cheng

(74) *Attorney, Agent, or Firm* — Treyz Law Group, P.C.; G. Victor Treyz; Matthew R. Williams

(57) ABSTRACT

An electronic device such as a fabric item or other item may have control circuitry. Buttons such as fabric-based buttons may be mounted within the device. A user may depress the buttons when it is desired to control operation of the device. Each button may have sensor circuitry such as capacitive sensor circuitry or resistive sensor circuitry. A control circuit can monitor conductive structures in the button to detect changes in electrical button characteristics such as capacitance and resistance and thereby gather information on button press events. Fabric buttons may have fabric movable button structures that are coupled to fabric support structures by fabric biasing structures. The fabric biasing structures may contain strands of material that are configured to form bistable fabric springs and/or hinges. The biasing structures and other fabric structures in a fabric button may be formed from knit fabric or other intertwined strands of material.

25 Claims, 13 Drawing Sheets

(56) References Cited

U.S. PATENT DOCUMENTS

| | | | |
|---|---|---|---|
| 2002/0135457 A1* | 9/2002 | Sandbach | H01H 13/785 338/47 |
| 2005/0160562 A1* | 7/2005 | Hasegawa | A44B 1/44 24/94 |
| 2006/0071751 A1* | 4/2006 | Wagner | H01H 13/702 338/47 |
| 2008/0105527 A1 | 5/2008 | Leftly | |
| 2009/0158562 A1* | 6/2009 | Contey | A44B 1/28 24/706.9 |
| 2013/0102217 A1* | 4/2013 | Jeon | D03D 15/00 442/182 |
| 2013/0229356 A1* | 9/2013 | Marwah | G06F 1/1616 345/170 |
| 2016/0018846 A1 | 1/2016 | Zenoff | |
| 2017/0247820 A1* | 8/2017 | Podhajny | D03D 25/005 |
| 2020/0089328 A1* | 3/2020 | Wang | G06F 3/0202 |

\* cited by examiner

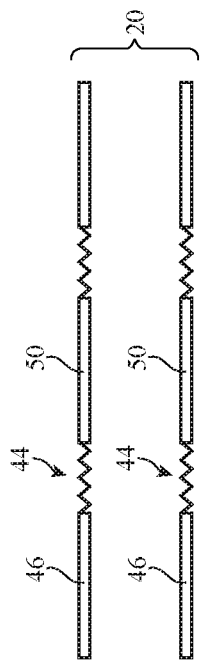
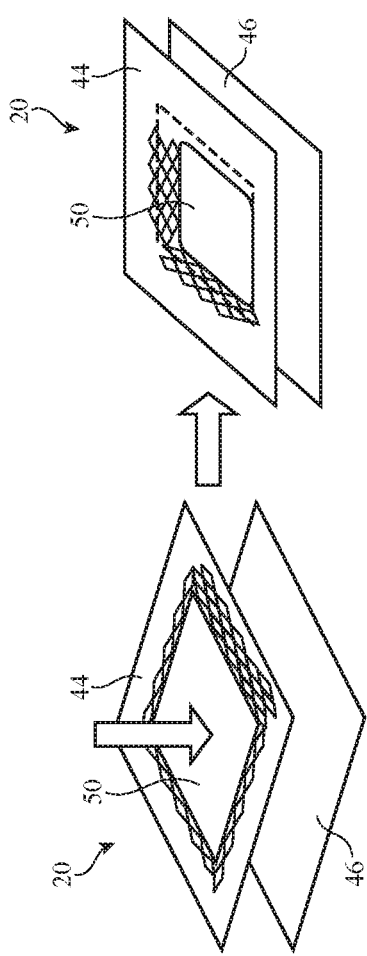
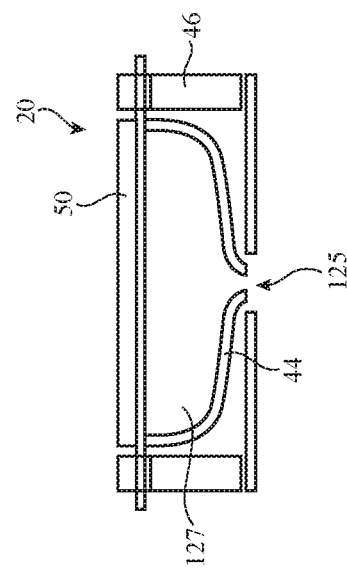
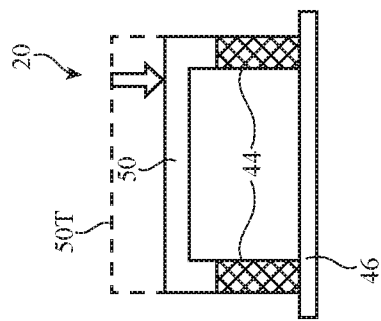

ELECTRONIC DEVICES WITH FABRIC BUTTONS

FIELD

This relates generally to electronic devices, and, more particularly, to electronic devices with fabric input-output components such as fabric buttons.

BACKGROUND

Buttons are used as input devices on electronic devices with keyboards and other electronic equipment. When a user desires to provide input, the user may press on the surface of a button. Depression of a button may change the state of a switch associated with the button. Control circuitry may monitor the switch to determine whether the switch is in an open state or closed state. In response to detecting a change in state of the switch, the control circuitry can take appropriate action.

If care is not taken, the input-output devices of an electronic device such as buttons may be formed from materials that are bulky, are uncomfortable to the touch, are unsightly, or have other properties that detract from using these input-output in the electronic device.

SUMMARY

An electronic device such as a fabric item or other item may have control circuitry. Buttons such as fabric-based buttons may be formed in the device. A user may depress the buttons when it is desired to control operation of the device using finger press input. Electronic devices with fabric buttons may include wristwatch bands, keyboards, enclosures, portable electronic devices such as cellular telephones or laptop computers, wearable items, or other items.

Each button may have sensor circuitry such as capacitive sensor circuitry or resistive sensor circuitry. A control circuit can monitor conductive structures in the button to detect changes in electrical button characteristics such as capacitance and resistance changes and thereby gather information on button press events. For example, a fabric button may have strands of conductive material or other conductive structures that form resistive paths, capacitive sensor electrodes, and other conductive structures that can be monitored by control circuitry.

Fabric buttons may have fabric movable button structures that are coupled to fabric support structures by fabric biasing structures. The fabric biasing structures may contain strands of material that are configured to form bistable fabric springs. The biasing structures and other fabric structures in a fabric button may be formed from knit fabric or other intertwined strands of material.

BRIEF DESCRIPTION OF THE DRAWINGS

FIG. 21 is a perspective view of an illustrative button with fabric in an uncompressed state in accordance with an embodiment.

FIG. 22 is a perspective view of the illustrative button of FIG. 21 in a compressed state in accordance with an embodiment.

FIG. 23 is a cross-sectional side view of illustrative fabric layers for a button in accordance with an embodiment.

FIG. 24 is a cross-sectional side view of a button with a fabric biasing structure in accordance with an embodiment.

FIG. 25 is a cross-sectional side view of a button having an air bladder with an opening in accordance with an embodiment.

DETAILED DESCRIPTION

An electronic device may be provided with input-output devices. The input-output devices may include buttons. The buttons may have movable portions that are depressed by a user. During operation, a user may press a finger against a button to supply button press input to an electronic device.

Any suitable item may be provided with buttons. To facilitate incorporation of buttons into a variety of different items, the buttons may be fabric buttons that are formed from intertwined strands of material. The strands of material may, for example, be intertwined to form fabric using braiding, weaving, knitting, or other strand intertwining process. In addition to forming all or part of a button, the fabric can be used in forming a housing for an item, a band for a wristwatch, an item of clothing, a cover, a wearable structure, or other fabric-based structure. Items with fabric buttons and other circuitry may sometimes be referred to herein as electronic devices.

Figure 1:
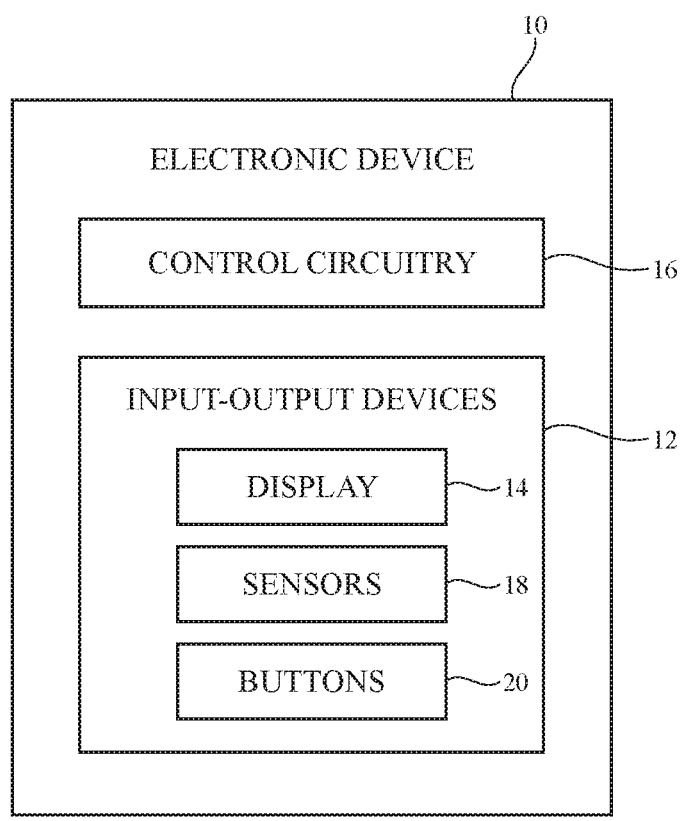
FIG. 1 is a schematic diagram of an illustrative electronic device in accordance with an embodiment.

An illustrative electronic device is shown in FIG. 1. Electronic device 10 may be a computing device such as a laptop computer, a computer monitor containing an embedded computer (e.g., a desktop computer formed from a display with a desktop stand that has computer components embedded in the same housing as the display), a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, a tower computer, an item of furniture, an embedded system such as a system in which electronic equipment is mounted in a kiosk or automobile, equipment that implements the functionality of two or more of these devices, or other electronic equipment. If desired, device 10 may be a removable external case for electronic equipment, may be a strap, may be a wristband or headband, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, sock, glove, shirt, pants, etc.), or may be any other suitable item. If desired, device 10 may include fabric (e.g., device 10 may be a fabric-based item, device 10 may have a housing structure that includes fabric, device 10 may be an item of clothing or other wearable item formed form fabric, may be a strap formed from fabric, a keyboard, case or other device formed from fabric, etc.).

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc. Control circuitry 16 may include wired and/or wireless communications circuitry (e.g., antennas and associated radio-frequency transceiver circuitry such as cellular telephone communications circuitry, wireless local area network communications circuitry, etc.). The communications circuitry of control circuitry 16 may allow device 10 to communicate with keyboards, computer mice, remote controls, speakers, accessory displays, accessory cameras, and/or other electronic devices that serve as accessories for device 10.

Input-output circuitry in device 10 such as input-output devices 12 may be used to allow data to be supplied to device 10 and to allow data to be provided from device 10 to external devices. Input-output devices 12 may include input devices that gather user input and other input and may include output devices that supply visual output, audible output, or other output. These devices may include buttons, joysticks, scrolling wheels, touch pads, devices with force and/or touch sensor input devices, key pads, keyboards, microphones, speakers, tone generators, vibrators and other haptic output devices, light-emitting diodes and other status indicators, optical sensors, data ports, etc.

Input-output devices 12 may include one or more displays such as display 14. Devices 12 may, for example, include an organic light-emitting diode display, a liquid crystal display, a projector display (e.g., a projector based on a micromechanical systems device such as a digital micromirror device or other projector components), a display having an array of pixels formed from respective light-emitting diodes (e.g., a pixel array having pixels with crystalline light-emitting diodes formed from respective light-emitting diode dies such as micro-light-emitting diode dies), and/or other displays. Display 14 may be a touch screen display that includes a touch sensor for gathering touch input from a user or display 14 may be a touch insensitive display that is not sensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. If desired, display 14 may have a force sensor for gathering force input (e.g., a two-dimensional force sensor may be used in gathering force input on display 14). In some configurations, edge lit light-guide layers or other light-emitting components may be used to produce illumination for device 10 and can replace one or more displays 14 and/or portions of displays 14 in device 10. Configurations in which display 14 is omitted from input-output devices 12 may also be used. In general, any suitable light-emitting devices (displays, light-emitting diodes, lasers, lamps, etc.) may be used in emitting light in device 10, if desired.

Input-output devices 12 may include sensors 18. Sensors 18 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor and/or a two-dimensional force sensor overlapping display 14, and/or a touch sensor or force sensor that forms a button, trackpad, or other input device not associated with a display), and other sensors. If desired, sensors 18 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors. In some arrangements, device 10 may use sensors 18 and/or other input-output devices to gather user input (e.g., buttons may be used to gather button press input, touch and/or force sensors overlapping displays can be used for gathering user touch screen input and/or force input, touch pads and/or force sensor may be used in gathering touch and/or force input, microphones may be used for gathering audio input, etc.).

If desired, electronic device 10 may include additional components (e.g., other devices in input-output devices 12). The additional components may include haptic output devices, audio output devices such as speakers, light sources such as light-emitting diodes (e.g., crystalline semiconductor light-emitting diodes for status indicators and/or displays) or lasers (e.g., vertical cavity surface emitting lasers and/or other laser diodes), other optical output devices, and/or other circuitry for gathering input and/or providing output. If desired, light sources (e.g., light-emitting diodes, lasers, or other light-emitting devices in input-output devices 12) may emit light into strands of transparent material (e.g., optical fibers in fabric or other optical fibers in device 10). Haptic output devices may include electromagnetic actuator, piezoelectric actuators, or other actuators, controlled by control circuitry 16. Device 10 may also include an optional battery or other energy storage device, connector ports for supporting wired communications with ancillary equipment and for receiving wired power, and other circuitry. Systems that include device 10 may also include wired and/or wireless accessories (e.g., keyboards, computer mice, remote controls, trackpads, etc.).

As shown in FIG. 1, device 10 may include buttons 20. Buttons 20 may include switches (e.g., on-off switches) and/or sensing circuitry that can detect when the buttons are pressed and when the buttons are not pressed. As an example, buttons 20 may include dome switches that have one state (e.g., closed or open) when pressed and an opposite state (open or closed, respectively) when not pressed. Buttons switches serve as force sensors that detect button press activity. If desired, strain gauge force sensors, force sensors such as capacitive or resistive force sensors, touch sensors, optical sensors, radio-frequency sensors, and/or other sensors can be used in detecting button press activity (e.g., by detecting finger press force on buttons 20).

Figure 2:
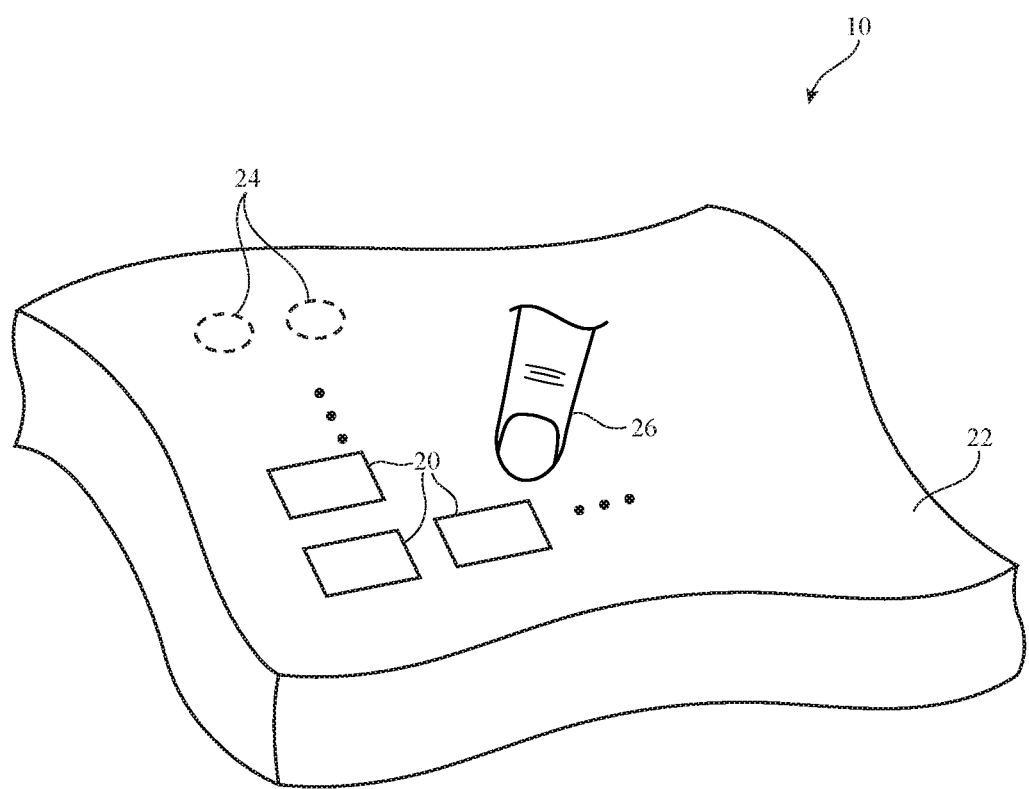
FIG. 2 is a perspective view of a portion of an illustrative electronic device with buttons in accordance with an embodiment in accordance with an embodiment.

A portion of electronic device 10 that includes buttons 20 is shown in FIG. 2. Buttons 20 may be used in isolation (e.g., one or two buttons or other small number of buttons 20 may be used in device 10) and/or buttons 20 may be used in arrays (e.g., to form keypads and/or keyboards such as QWERTY keyboards). Buttons 20 may be formed partially or entirely form fabric. In the example of FIG. 2, device 10 includes housing 22. Housing 22, which may sometimes be referred to as an enclosure or case, may form supporting structures in device 10. For example, in a configuration in which device 10 is a keyboard, housing 22 may form keyboard housing walls. Portions of housing 22 may, in some configurations, form support structures for buttons 20. In a configuration in which device 10 is a wearable item, housing 22 may be a wearable structure such as a strap, hat, glove, shirt, etc.

Housing 22 may be formed from fabric (e.g., housing 22 and buttons 20 may contain integrally formed fabric structures) and/or may be formed from other materials (e.g., flexible and/or rigid structures formed from metal, polymer, natural materials such as cotton, ceramic, crystalline materials such as sapphire, glass, carbon fiber materials and other fiber composite materials, other materials, and/or combination of these materials). Components 24 (e.g., integrated circuits, sensors, and other components such as control circuitry 16 and/or input-output devices 12 of FIG. 1) may be mounted within an interior region in housing 22 and/or may be coupled to exterior surfaces or other portions of housing 22. For example, housing 22 may have an interior that encloses a battery, control circuitry, and input-output devices and may have portions that support buttons 20.

Buttons 20 may have portions that are accessible from the exterior of device 10. For example, buttons 20 may be formed on the outer surface of housing 22. In this position, a user may press a finger such as finger 26 or other external object against selected buttons 20. Button input (which may sometimes be referred to as finger press input or button press input) may be used in controlling device 10. For example, control circuitry 16 may change the content that is displayed on display 14 and/or may otherwise control the operation of device 10 based on user input provided by pressing on buttons 20.

Any desired portions of buttons 20 may be formed from fabric. For example, biasing structures within buttons 20 (e.g., bistable elements such as bistable springs and/or hinges that provide bistable force feedback during button press events, etc.) may be formed from fabric, movable button structures and support structures may be formed from fabric, etc. If desired, exterior touchable surfaces of buttons 20 (sometimes referred to as key caps, button members, button press surface structures, etc.) may be formed from fabric to provide a user of buttons 20 with a desired tactile experience when interacting with buttons 20. If desired, exterior touchable surfaces of buttons 20 may be formed partially or fully from rigid members of polymer, metal, glass, and/or other materials. In arrangements in which the strands of material in fabric 30, button 20, or other structures in device 10 are formed from transparent material, the strands may serve as optical fibers and can receive illumination from a light-emitting diode, laser, or other light-emitting device. The light that is provided into these strands may be conveyed along the lengths of the strands in accordance with the principal of total internal reflection. Light-scattering features in the fibers (e.g., rough surface structures, light-scattering particles, etc.) can locally defeat total internal reflection and thereby cause the light guided within the optical fibers (e.g., the strands of material in fabric 30, in button 20, etc.) to scatter outwardly for viewing by a user.

Optical fibers such as transparent strands of material in fabric 30 may be used to provide illumination for button 20 or other components of device 10. For example, illuminated optical fibers in fabric 30 may be used to illuminate trim in fabric 30, to illuminate patches of fabric 30 (or all of fabric 30), and/or to create alphanumeric labels or other patterned areas that are illuminated. If desired, the entire exposed surface of a button press input surface on a movable fabric button member may be illuminated (e.g., by incorporating illuminated optical fibers in the fabric forming the button press input surface).

In configurations in which a patch or global region of fabric 30 is provided with illumination using transparent strands of material that receive light from light-emitting devices, opaque ink or other masking structures (e.g., patterned opaque layers of metal, polymer, fabric, etc. with desired light-transparent openings or windows) may be formed on top of the transparent strands of material. In this way, the masking structures can define alphanumeric characters or other labels, or other patterns for emitted light from optical fibers in fabric 30. For example, buttons 20 may have illuminated labels (e.g., alphanumeric characters) that use optical fibers in fabric 30 or other structures to output light. To backlight buttons 20, buttons 20 (e.g., fabric 30 forming some or all of buttons 20) may be configured to overlap light-emitting structures. The light-emitting structures may include light-emitting devices, light guide layers (e.g., plates and/or films of clear polymer that are edge illuminated by light-emitting devices and that contain light extraction features for locally defeating total internal reflection so that light from the light guide layer travels vertically through buttons 20, or light-emitting fabric formed from transparent strands of material receiving light from light-emitting devices.

Buttons 20 may be depressed during use. To allow buttons 20 to move and flex during operation, buttons 20 may include springs or other biasing structures. When a given button 20 is depressed by a user, a spring or other biasing structure in the button may compress. When the button is released, the spring or other biasing structure may help restore the button to its original configuration. Springs and other biasing structures may, in some configurations, allow a button to exhibit non-linear force versus displacement characteristic and may provide the button with features such as detents, bistability, and other desired tactile attributes (e.g., a desired click feel). Springs may be formed from intertwined strands of material such as fabric (e.g., elastomeric fabric, fabric constructed to serve as a biasing member, etc.) and/or may be formed from spring metal, polymer spring structures, or other spring mechanisms.

The strands of material that form a fabric button (e.g., a button 20 that is formed partially or fully from fabric) may be intertwined using weaving, knitting, braiding, and/or other strand intertwining techniques.

Figure 3:
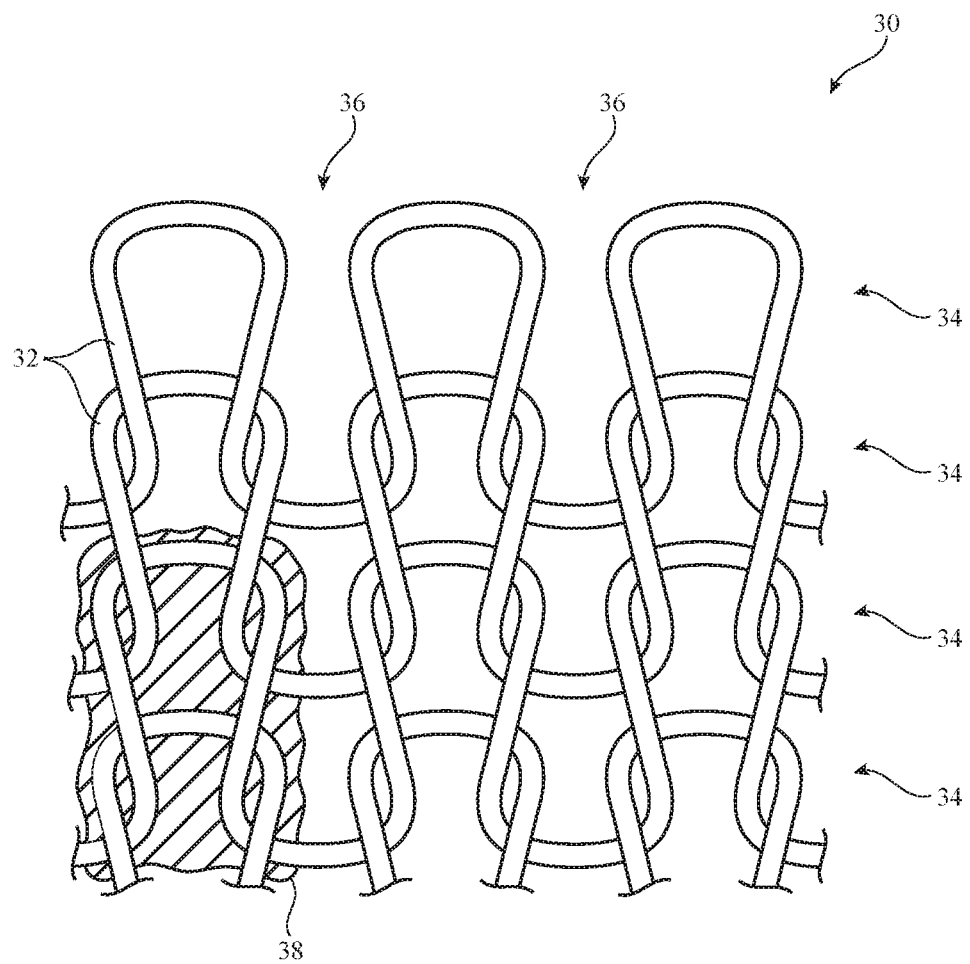
FIG. 3 is a diagram of illustrative fabric in accordance with an embodiment.

FIG. 3 is a top view of illustrative knit fabric 30 for use in device 10. In the illustrative configuration of FIG. 3, fabric 30 has a single layer of knit strands 32 that form horizontally extending rows of interlocking loops (courses 34) and vertically extending wales 36. Other types of knit fabric may be used in item 10, if desired.

Some or all of buttons 20 and structural portions of device (item) 10 such as housing structures, wristbands, headbands, other wearable components, housing walls that serve as covering layers, and other portions of device 10 may be formed from fabric 30. The fabric structures of device 10 may be soft (e.g., device 10 may have a fabric surface that yields to a light touch), may have a rigid feel (e.g., the surface of device 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

The strands of material in fabric 30 such as strands 32 may be single-filament strands (sometimes referred to as fibers or monofilaments), may be yarns or other strands that have been formed by intertwining multiple filaments (multiple monofilaments) of material together, or may be other types of strands (e.g., tubing). The strands may include extruded strands such as extruded monofilaments and yarn formed from multiple extruded monofilaments. Monofilaments for fabric 30 may include polymer monofilaments and/or other insulating monofilaments and/or may include bare wires and/or insulated wires. Monofilaments formed from polymer cores with metal coatings and monofilaments formed from three or more layers (cores, intermediate layers, and one or more outer layers each of which may be insulating and/or conductive) may also be used.

As shown in FIG. 3, fabric 30 may include one or more portions with polymer or other binder 38 to hold strands such as strands 32 in fabric 30 together. The binder may be, for example compliant material such as silicone, thermoplastic elastomer, polyurethane, or other elastomeric polymers (as examples). If desired, polymers such as these may be molded over rigid frames and other support structures in addition to or instead of incorporating this material into fabric 30. Magnetic particles (e.g., particles of iron, ferrite, etc.) or other magnetic filler material, conductive particles (e.g., metal particles, carbon particles, etc.), pigment and/or dye, and/or other materials may be incorporated into binder 38, if desired. In some arrangements, strands 32 may be fused together by application of heat and/or pressure. Adhesive or other attachment mechanisms may be used to attach fabric 30 to support structures such as frame members, housing structures (e.g., an electronic device housing), and other mechanical structures. In this way fabric-based buttons, fabric housing structures, and other structures for device 10 may be formed using fabric 30. If desired, fabric 30 may be formed by weaving (e.g., fabric 30 may include woven fabric), may be formed from braiding (e.g., fabric 30 may include braided fabric), and/or may be formed using other strand intertwining techniques. The use of knitting to form fabric 30 of FIG. 3 is illustrative. If desired, portions of fabric 30 may be supported by and/or replaced by molded polymer structures in device 10.

Figure 4:
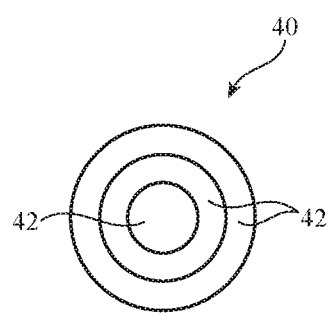
FIG. 4 is a cross-sectional view of an illustrative strand of material in accordance with an embodiment.

FIG. 4 is a cross-sectional view of an illustrative strand for fabric 30. Strands such a strand 40 of FIG. 4 may be used in forming strands such as strands 32 of FIG. 3. As shown in FIG. 4, strands 40 may contain one or more layers 42 (e.g., a core layer, a first coating layer on the core, a second coating layer on the first coating layer, etc.). Each of layers 42 in the strands in fabric 30 may be formed from polymer, metal, glass, graphite, ceramic, natural materials as cotton or bamboo, or other organic and/or inorganic materials and/or combinations of these materials. Conductive coatings such as metal coatings may be formed on non-conductive material. For example, plastic yarns and monofilaments in fabric 30 may be coated with metal to make them conductive. Optional insulating coatings may be formed on conductive coatings. Yarns may be formed from a bundle of bare metal wires, insulated metal wires, or metal wire intertwined with insulating monofilaments (as examples). In some arrangements, magnetic material (e.g., iron, ferrite, or other magnetic material) may be used in forming one or more layers 42 in strands 40.

Strands of material may be intertwined to form fabric 30 using intertwining equipment such as weaving equipment, knitting equipment, or braiding equipment. Intertwined strands may, for example, form woven fabric, knit fabric, braided fabric, etc. Conductive strands and insulating strands may be woven, knit, braided, or otherwise intertwined to form sensor components such as capacitive sensor electrodes and/or may be intertwined to form other conductive structures such as contact pads that can be electrically coupled to the contact pads of an electrical component (e.g., using solder, conductive adhesive, welds, crimped connections, etc.).

Conductive and insulating strands may be woven, knit, or otherwise intertwined to form conductive paths. The conductive paths may be used in forming signal paths (e.g., signal buses, power lines, spiral shapes, circular coils, springs, etc.), may be used in forming part of a button sensor (e.g., a capacitive sensor or resistive sensor that response to the touch and force input associated with button press input), a capacitive touch sensor electrode, a resistive touch sensor electrode, a haptic output device, or other input-output device, or may be used in forming other patterned conductive structures. Conductive structures in fabric 30 may be used in carrying power signals, digital signals, analog signals, sensor signals, control signals, data, input signals, output signals, or other suitable electrical signals. Magnetic structures in fabric 30 may be used in forming magnets and/or structures that attract magnets.

Circuitry such as control circuitry 16 and input-output devices 12 of FIG. 1 may be included in device 10 and used in gathering button press input from fabric-based buttons 20. This circuitry may include electrical components that are coupled to buttons 20 that include fabric 30, electrical components that are housed within an interior region of an enclosure formed by fabric, electrical components that are attached to fabric using welds, solder joints, adhesive bonds (e.g., conductive adhesive bonds such as anisotropic conductive adhesive bonds or other conductive adhesive bonds), crimped connections, or other electrical and/or mechanical bonds. Signal lines formed from conductive strands and/or metal traces on printed circuits may be used to electrically couple control circuitry 16 and input-output devices 12 such as buttons 20. The circuitry for device 10 may include metal structures for carrying current, electrical components such as integrated circuits, light-emitting diodes, sensors, controller circuitry for applying currents and/or magnetic fields to materials, electrically controlled devices for illuminating tubing and/or applying control signals to tubing or other strands, and other electrical devices. Control circuitry 16 may be used to control the operation of device 10 by monitoring buttons 20 for button press input and controlling electrically controllable (electrically adjustable) components in device 10 in response to button press input and other input.

Figure 5:
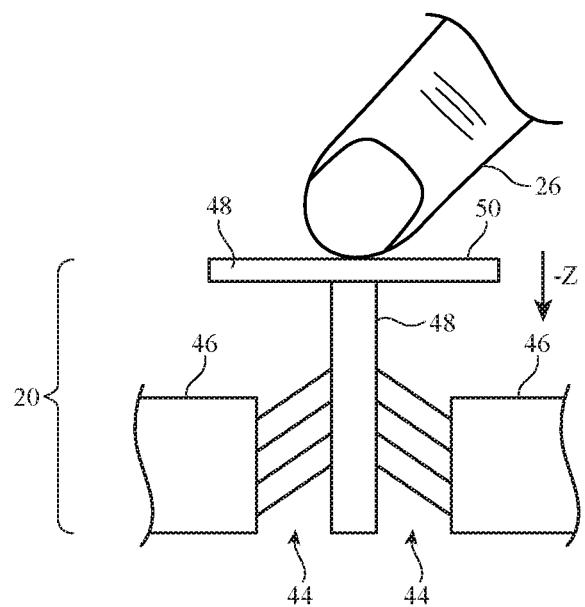
FIGS. 5, 6, and 7 are cross-sectional side views of an illustrative button during use in accordance with an embodiment.

FIG. 5 shows illustrative structures that may be used in device 10 to form a fabric-based button. In the example of FIG. 5, fabric-based button 20 includes biasing structure 44. Structure 44 and/or other portions of button 20 such as movable button structure 48 and support structure 46 may be formed from knit fabric and/or other fabric 30 (e.g., structures in button 20 may be formed from strands 32). Configurations in which some or all of these structures are formed from non-fabric structures (e.g., molded polymer structures, rigid polymer structures with soft elastomeric coatings, flexible polymer structures, structures formed from flexible and/or rigid polymer, metal, etc.) may also be used. Strands 32 in button 20 may include individual strands and/or intertwined strands such as strands that have been woven, knit, and/or braided to form biasing structures 44. These strands may extend both through portions of housing 22 and portions of button 20 and/or separate strands or sets of strands may be used for button 20 and housing 22. Strands 32 may include illuminated optical fibers for providing button 20 with illumination. For example, a layer of fabric 30 with illuminated strands of transparent material (e.g., strands of material with light-scattering structures) may be used to create an illuminated fibrous layer that serves as the outer layer of button 20 and/or as a backlight layer. If desired, illumination for fabric 30 or other structures in movable button structure 48 may also be provided by backlighting structure 48 with light-emitting diodes or other light-emitting devices. Patterned masks may be used to create desired light output patterns (e.g., button labels such as alphanumeric characters, icons, etc.).

Biasing structures 44 for buttons 20 may be configured to serve as bistable springs and/or hinges (e.g., hinges that exhibit bistability) and these structures may be configured to help ensure that button 20 exhibits desired click feel and motion during button press events (e.g., to exhibit bistability for click feel while reducing twisting, wobbling, and other non-parallel motion). In some configurations, portions of biasing structures 44, support structures 46, and/or movable button structures 48 may be formed from materials other than fabric (e.g., polymer, glass, or metal members). Arrangements in which button 20 is formed from fabric are sometimes described herein as an example. Fabric for biasing structures 44 and/or other fabric structures in button 20 may be single layer fabric, dual-layer fabric, or fabric formed using more than three layers of fabric. A multilayer fabric may be formed by weaving, knitting, etc. and/or may be formed by laminating together sheets of single-layer fabric.

Support structure 46 may form part of a device housing, a strap or other wearable item, or other portion of device 10. As a user presses inwardly on movable button structure 48, button structure 48 moves in the −Z direction relative to support structure 46 (e.g., button 20 is depressed). This button press activity may be detected using capacitive sensing, resistive sensing, strain sensing, optical sensing, contact-switch sensing, or other sensing technique that is sensitive to changes in force, touch, movement, etc. Capacitive and resistive sensing arrangements may sometimes be described herein as examples. Capacitive sensor electrodes, resistive sensor structures, or other structures for sensing movement of button 20 may be formed using conductive strands and/or other conductive signal paths in device 10 (e.g., conductive strands in structures 48 and/or structures 46, metal traces formed from thin-film coatings, conductive polymer, and/or other conductive material, etc.).

Biasing structure 44 may be configured to produce a non-linear force versus displacement characteristic. As an example, consider an illustrative button 20 when in an undepressed configuration of the type shown in FIG. 5. In this arrangement, a relatively large amount of force is needed to overcome the mechanical resistance provided by biasing structures (springs) 44, because these springs are angled toward finger 26. After this initial resistance is overcome, structures 44 may buckle and offer less resistance (see, e.g., FIG. 6). Additional downward (inward) pressure on button structures 48 will cause biasing structures 44 to take on the configuration of FIG. 7, where force feedback again increases when structures 44 become fully extended in the downward direction and the travel on button 20 ends. When button 20 is released (e.g., when finger 26 is removed from the button press input surface 50), biasing structures 44 may exhibit a restoring force that returns button 20 to its original (undepressed) state of FIG. 5.

Figure 6:
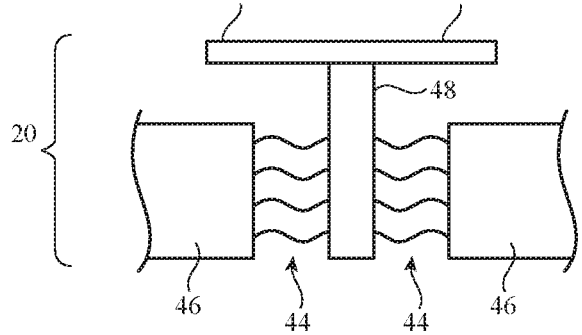
Figure 7:
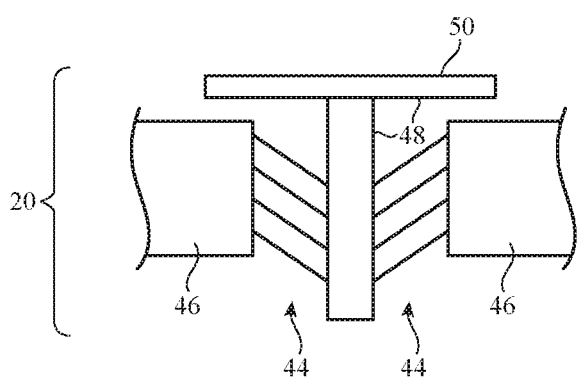
Figure 8:
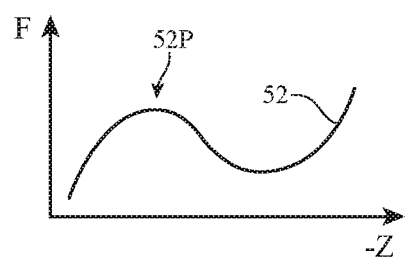
FIG. 8 is a graph of force-versus-displacement for an illustrative button with a bistable biasing structure such as a bistable fabric spring in accordance with an embodiment.

A graph showing how button 20 of FIGS. 5, 6, and 7 may be characterized by a non-linear curve (curve 52) of feedback force F versus displacement in the −Z direction is shown in FIG. 8. There are two minimum points for the force F versus distance −Z with curve 52, so this type of response may sometimes be referred to as a bistable response. The initial high resistance associated with curve peak 52P of curve 52 followed by the drop in resistance after peak 52P has been passed helps provide button 20 with a desired tactile response—sometimes referred to as click feel—during button press events.

Figure 9:
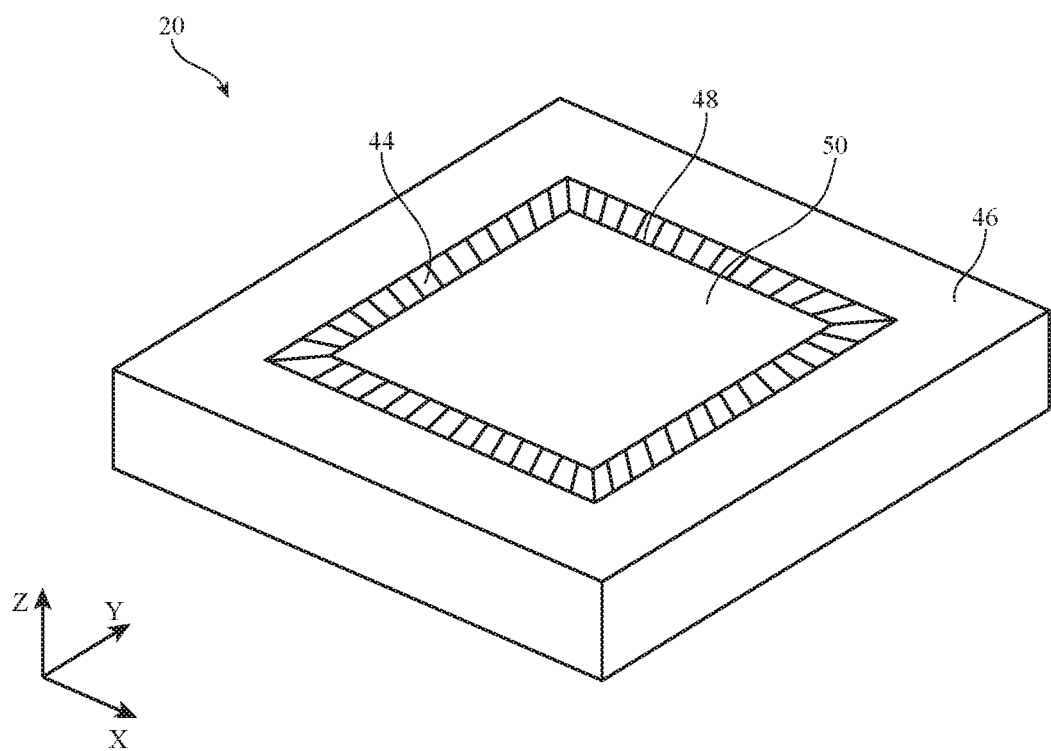
FIG. 9 is a perspective view of a portion of an electronic device having a button in accordance with an embodiment.

FIG. 9 is a perspective view of an illustrative fabric-based button. In the example of FIG. 9, button press input surface 50 of movable button structure 48 has a rectangular outline (e.g., to serve as an alphanumeric key). Other button shapes may be used, if desired. Movable button structure 48 serves as a depressible button portion for button 20 and is depressed in the −Z direction when a user's finger exerts force on button press input surface 50. Biasing structure 44 may span a gap between the periphery of structure 48 and adjacent portions of support structure 46 (which may be, if desired, integral with a fabric housing in device 10 or other support structures) and may couple movable button structure 48 to button support structure 46. Support structure 46 may be formed as part of housing 22 (e.g., support structure 46 and housing 22 may share common strands 32) and/or support structure 46 may be mounted to housing 22. During button press events, support structure 46 may serve as a static portion of button 20. Biasing structure 44 may be characterized by a bistable force-feedback versus displacement curve of the type shown in FIG. 8 or may exhibit other suitable tactile responses during button press events.

Figure 10:
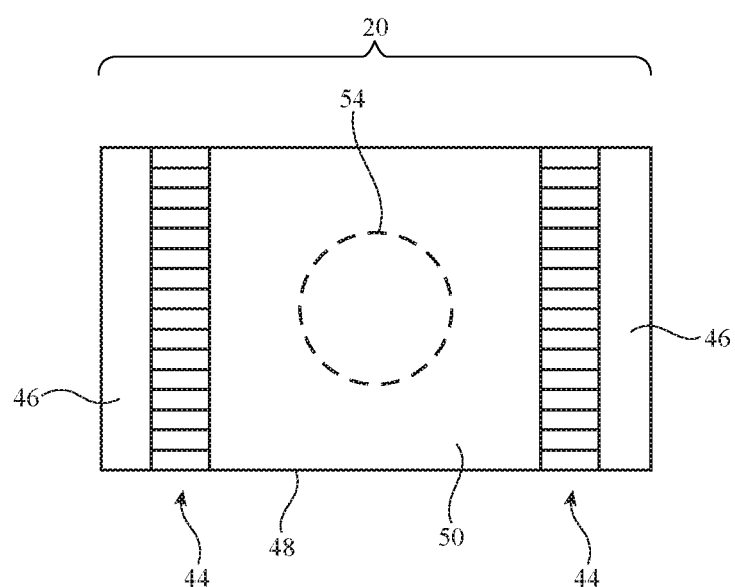
FIG. 10 is a top view of an illustrative button in accordance with an embodiment.

In the example of FIG. 9, biasing structures 44 surround movable button structure 48 and run along each of the four edges of button structure 48. In the example of FIG. 10, there are two separate strips of biasing structures 44 in button 20 each of which is coupled between a respective button support structure 46 and a corresponding left or right edge of movable button structure 48. Biasing structures 44 of FIG. 10 may be configured to exhibit bistability or other desired force-versus-displacement characteristics (e.g., characteristics of the type shown by curve 52 of FIG. 8). FIG. 10 also shows how button 20 may include a component such as component 54 (e.g., a domes switch or other mechanical switch, a capacitive sensor, a resistive sensor, and/or other sensor for detecting movement, touch, force, and/or other attributes associated with a button press event as a user's finger presses downward on surface 50).

Figure 11:
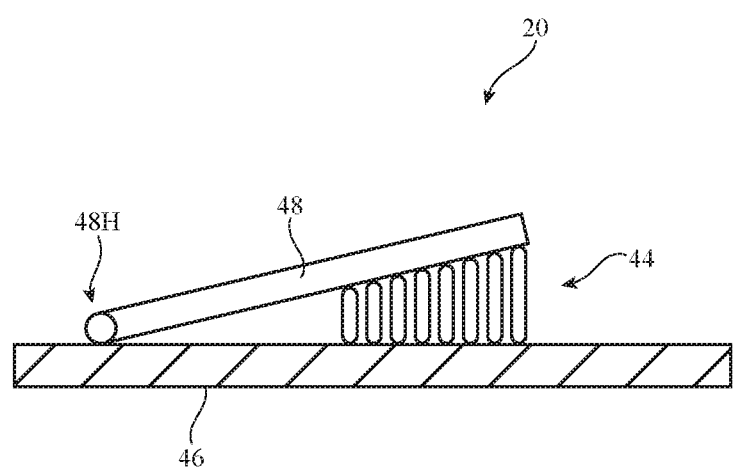
FIG. 11 is a side view of an illustrative button in accordance with an embodiment.

FIG. 11 is a side view of another illustrative fabric button. In the illustrative configuration of FIG. 11, movable button structure 48 is coupled to static support structure 46 by hinge structure 48H. Hinge structure 48H, movable button structure 48, biasing structure 44 (e.g., a strand-based spring such as a bistable spring), and/or support structure 46 may be formed fully or partially from fabric 30.

Figure 12:
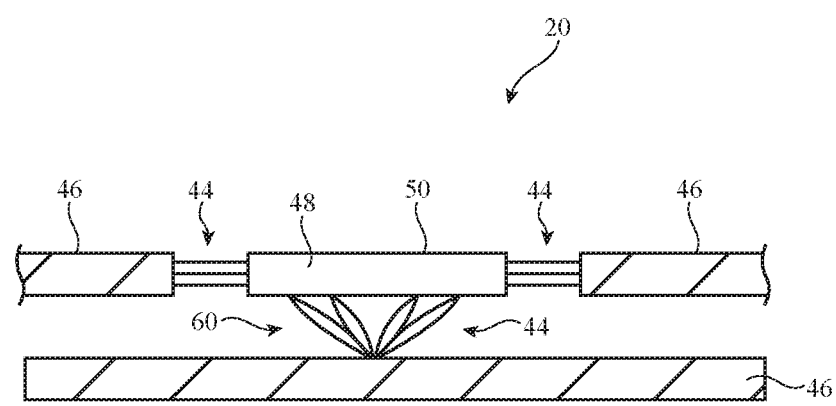
FIG. 12 is a cross-sectional side view of an illustrative button with a fabric spring in accordance with an embodiment.

In the example of FIG. 11, button 20 rotates about a hinge axis aligned with hinge 48H. FIG. 12 is a cross-sectional side view of button 20 in an illustrative configuration in which biasing structure 44 (e.g., a fabric spring, etc.) may be used not only to laterally couple movable button member 48 to laterally adjacent portions of support structure 46 but also to serve as vertical biasing structures. In particular, biasing structure 44 may include knit fabric or other intertwined strands of material in region 60 between movable button member 48 and overlapped portions of support structure 46. The biasing structure in region 60 may serve as a button spring that helps restore button 20 to its desired undepressed state after a finger or other external object is released following a button press event on surface 50. Biasing structure 44 of FIG. 12 may exhibit bistability and/or other button press characteristics.

Figure 13:
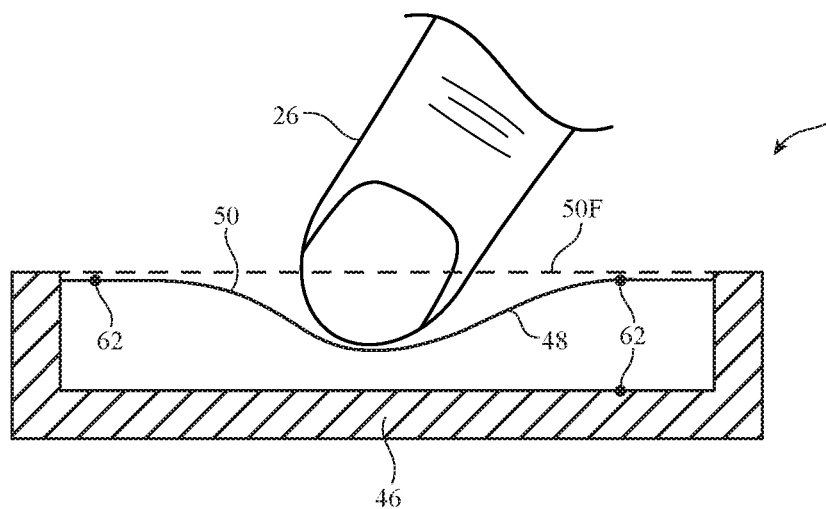
FIG. 13 is a cross-sectional side view of an illustrative button during a button press event in accordance with an embodiment.

FIG. 13 is a cross-sectional side view of button 20 in an illustrative configuration in which button 20 includes sensing circuitry. As shown in FIG. 13, upper button surface 50 may be flat (e.g., in position 50F) in its undepressed state. When a user's finger 26 or other external object presses inwardly on button 20, surface 50 will deflect inwardly as shown in FIG. 13. Portions of movable button structure 48 of FIG. 13 may form biasing members 44 and/or separate biasing structures 44 may be used to provide button 20 with a desired force-versus-displacement characteristic. Conductive structures (e.g., conductive strands, metal traces, electrodes formed from patches of conductive fabric and/or other conductive structures) may be used to form sensors. Terminals such as terminals 62 may be coupled to these conductive structures and can be monitored by control circuitry 16.

During button actuation, physical attributes associated with button 20 such as resistance and capacitance attributes change due to the stretching and movement of the conductive structures (e.g., stretching of signal paths formed from fabric, movement of a conductive fabric upper electrode or other upper electrode in structure 48 towards an opposing conductive fabric lower electrode or other lower electrode formed in an overlapped portion of support structure 46, compression of conductive structures against each other, etc.). These changes in the electrical characteristics of button 20 are measured in real time by control circuitry 16 (e.g., by measuring capacitance, voltage, current, resistance, or other characteristics at two or more terminals 62). As an example, a first electrode 62 may be coupled to a capacitor electrode formed from conductive structures in fabric forming movable structure 48 and a second electrode 62 may be coupled to a capacitor electrode formed from conductive structures in fabric within support structure 46. In this illustrative configuration, capacitive sensor circuitry in control circuitry 16 can detect button presses by monitoring changes in the capacitance between the first and second electrodes 62. Resistance sensing arrangements may be used in configurations in which the resistance between laterally separated terminals 62 changes as fabric in structure 48 is stretched and/or when the resistance between upper and lower terminals 62 changes due to contact and electrical shorting between conductive upper and lower electrodes in button 20.

Figure 14:
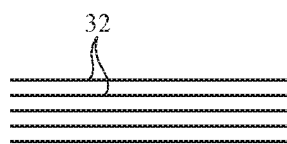
FIG. 14 is a side view of an illustrative set of conductive strands in accordance with an embodiment.
Figure 15:
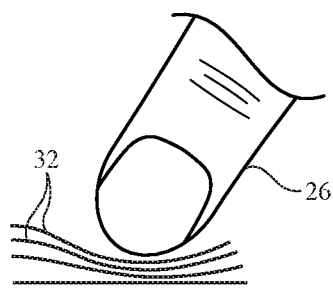
FIG. 15 is a side view of the illustrative set of conductive strands during compression of the strands in accordance with an embodiment.

Another illustrative button press sensor arrangement involves the use of parallel conductive strands 32 in button 20. Compression of adjacent strands 32 presses these strands together, which affects measureable electrical characteristics such as capacitance and/or resistance. Consider, as an example, the bundle of metal strands or other conductive strands 32 of FIGS. 14 and 15. These strands may be included in structure 48, structure 46, structure 44, and/or other button structures. Initially, in an undepressed state, strands 32 may be uncompressed (see, e.g., FIG. 14). When force is applied to button 20 by finger 26, strands 32 may be compressed together as shown in FIG. 15. Control circuitry 16 can measure the capacitance and/or resistance between respective strands 32 to detect button press input.

Figure 16:
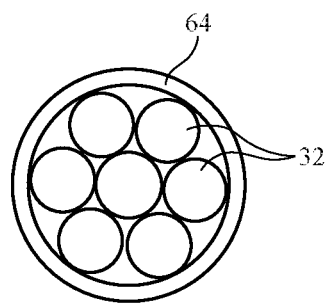
FIG. 16 is a cross-sectional view of an illustrative multifilament strand in accordance with an embodiment.

FIG. 16 is a cross-sectional side view of an illustrative strand formed from a bundle of multiple conductive strands 32 within hollow cylindrical sheath 64 (e.g., a polymer tube). When pressed together, the capacitance and/or resistance between respective strands 32 of the strand of FIG. 16 may change. By incorporating strands of the type shown in FIG. 16 into the fabric of button 20, button press input can be detected by control circuitry 16.

It may be desirable to incorporate structures into button 20 that help restrict undesired button movements. Consider, as an example, button 20 of FIG. 17, which is actuated when a user presses downwardly in the −Z direction on button surface 50 of movable button structure 48. The Z direction (and −Z direction) are parallel to the surface normal of button surface 50. Wobbling, twisting, and other movement that is not parallel to the Z axis of FIG. 17 may produce undesired tactile feedback. To ensure that movable button structure 48 (e.g., a fabric button member or other movable button member) moves parallel to the Z axis of FIG. 17, button 20 may be provided with multiple hinges. Each hinge may have a movable structure of fabric or other material such as movable button structure 48M that is sandwiched between two angled sets of biasing structures 44 (e.g., first and second biasing structure portions that each have strands of material that are oriented at a non-zero angle with respect to the direction along which structure 48M moves).

Figure 17:
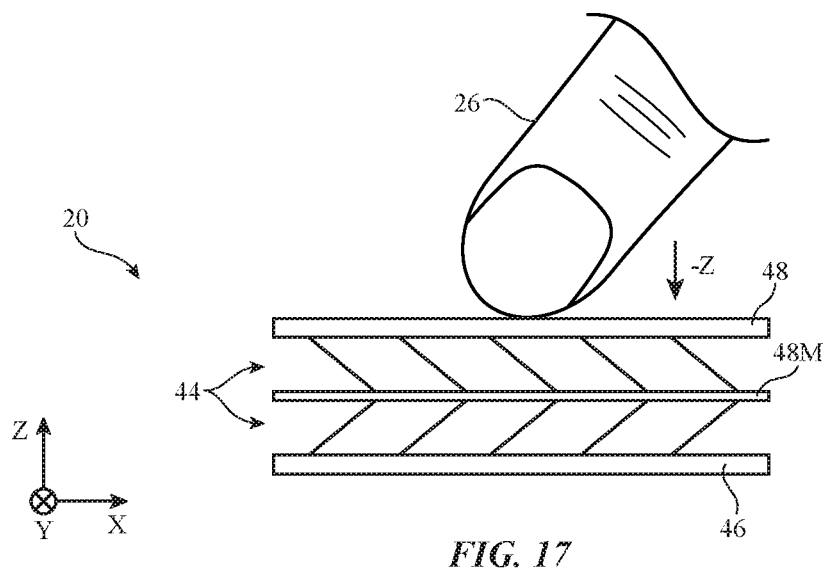
FIG. 17 is a cross-sectional side view of an illustrative button with hinge structures that help the button depress vertically without rotation or other non-parallel motion in accordance with an embodiment.

When button 20 is depressed, biasing structures 44 of FIG. 17 (which forms a first hinge for button 20) will tend to collapse and move structure 48M to the right in the X direction. Structures 44 may form slat-shaped structures for the first hinge that extend into the page of FIG. 17 and thereby prevent twisting motion within the X-Y plane. The first hinge prevent twisting motion, but may permit some motion along the X direction. To prevent X-direction motion and thereby ensure that motion of structure 48 follows the Z axis, a second hinge may be oriented along the Y direction of FIG. 17, orthogonal to the X-axis orientation of the first hinge. With this arrangement, the first and second hinges extend respectively along first and second axes that are orthogonal to each other and have respective first and second movable portions that move respectively along the first and second axes when the movable button structure is depressed along the path that is parallel to the surface normal.

Figure 18:
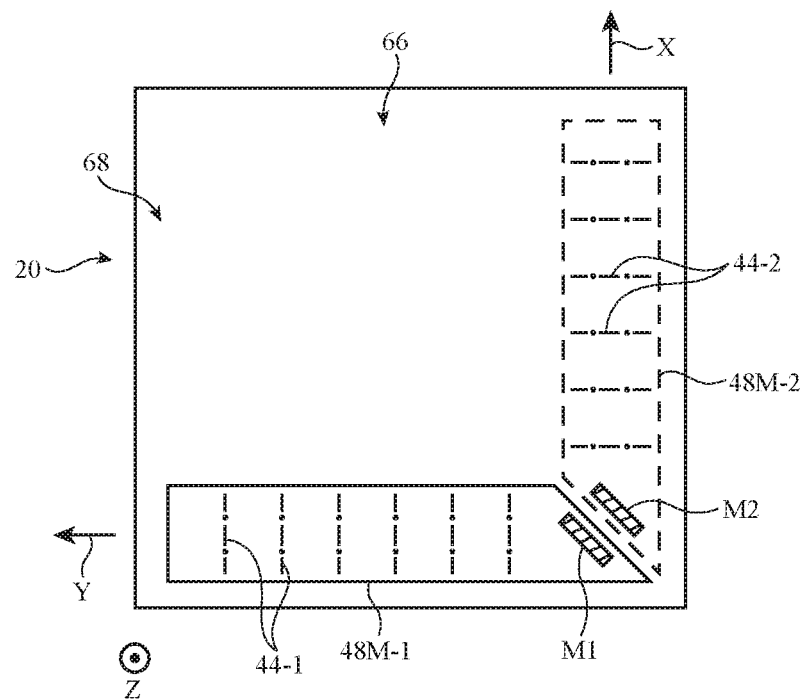
FIG. 18 is a top view of an illustrative button of the type shown in FIG. 17 in accordance with an embodiment.

As this example, demonstrates, parallel movement can be obtained (and twisting and/or wobbling can be reduced) by providing two or more sets of biasing structures 44 around the periphery of button structure 48 that extend along at least two non-parallel directions. As shown in the top view of button 20 of FIG. 18, for example, biasing structure 44 for button 20 may have a first portion 44-1 and first movable button structure 48M-1 that form a hinge that can move only in direction Y and a second portion 44-2 and second movable button structure 48M-2 that form a hinge that can move only in direction X. When button 20 is pressed inwardly in the −Z direction, first portion 44-1 and structure 48M-1 will allow button 20 to collapse along the −Z direction, but will resist motion of button structure 48 in the X direction, whereas second portion 44-2 and structure 48M-2 will allow button 20 to collapse along the −Z direction, but will resist motion of button structure 48 in the Y direction. Button structure 48 will therefore tend not to twist or wobble due to the movement constraints imposed by orthogonally oriented biasing structure portions 44-1 and 44-2.

If desired, additional hinge structures to help ensure parallel motion may be included in button 20 (e.g., in regions such as regions 66 and/or 68). Structures 44 and 48 (e.g., illustrative portions 44-1 and 44-2, and/or portions 48M-1 and 48M-2) may be formed from fabric or other suitable materials (e.g., as integral portions of support structure 46 and/or other portions of button 20. If desired, biasing structure 44 may be configured to exhibit bistability (e.g., to implement a desired force-versus-displacement characteristic, sometimes referred to as "click feel") and/or additional components such as magnets M1 and M2 of FIG. 18 may be included in button 20. Magnets M1 and M2 may, for example, be configured to attract each other and provide an initial resistance (e.g., button press resistance due to magnetic attraction which opposes movement of structure 48M-1 in the Y direction while structure 48M-2 is moving in the X direction). Once this initial resistance is overcome by sufficient separation between magnets M1 and M2, magnets M1 and M2 will no longer attract each other strongly (e.g., button resistance to applied force will reduce until button 20 reaches the end of its travel as shown, for example, in connection with curve 52 of FIG. 8).

Figure 19:
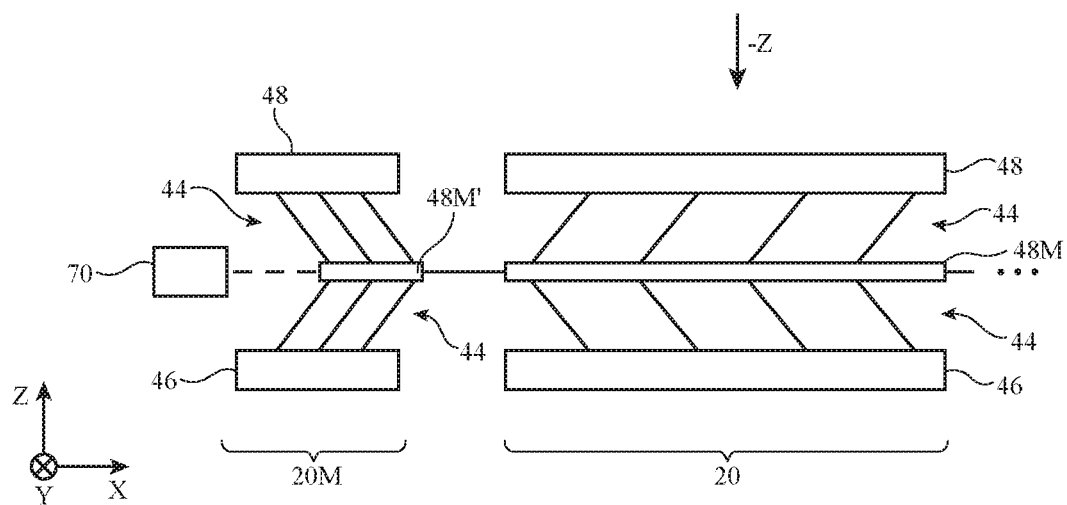
FIG. 19 is a cross-sectional side view of an electronic device with one or more buttons in accordance with an embodiment.

In the example of FIG. 19, movable button structure 48M of button 20 is coupled to associated movable structure 48' of bistable button biasing structure 20B. Button 20 may have hinge structures formed from diagonally oriented biasing structures 44 to help ensure parallel button motion as described in connection with 18. Bistable structure 20B may provide a force-versus-displacement response of the type shown by curve 52 of FIG. 8 and described in connection with FIGS. 5, 6, and 7. By coupling structure 20B to button 20, button 20 may be provided with a desired click feel. Optional haptic device 70 (e.g., an electromagnetic or piezoelectric haptic actuator) may be coupled to one or more buttons 20 and may be used to provide haptic output to a user touching a button (e.g., device 70 may be used to enhance click responses and provide other haptic feedback as buttons 20 are depressed).

Figure 20:
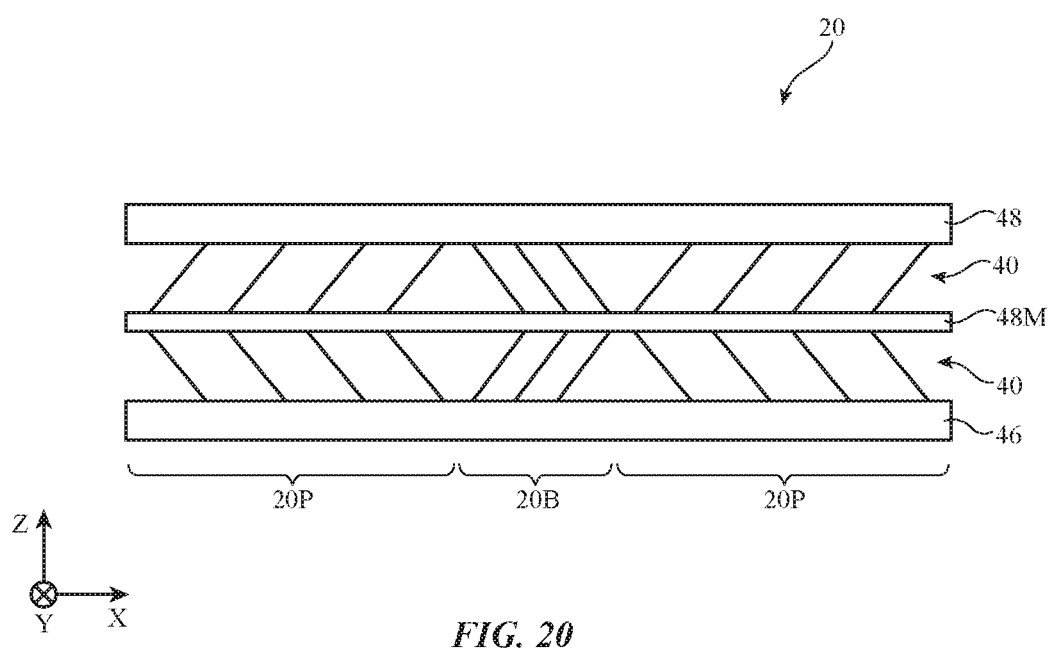
FIG. 20 is a cross-sectional side view of a button with biasing structures configured to form a hinge that resists twisting motion and that serves as a bistable spring in accordance with an embodiment.

Another illustrative configuration for button 20 is shown in FIG. 20. In the example of FIG. 20, button portions 20P have biasing structures that are configured to serve as a hinge. Multiple orthogonally oriented hinges may be included in button 20 to enhance parallel motion. Bistability portions 20B of button 20 help provide a desired click feel for button 20 (e.g., a force-versus-displacement characteristic such as curve 52 of FIG. 8). As shown in this illustrative arrangement, portion 20B may have biasing structures 44 that, at least initially, hinder the type of motion promoted by biasing structures 44 of button portions 20P. For example, when button portions 20P are compressed in the example of FIG. 20, member 48M will be pushed in the −X direction. As described in connection with the arrangement of FIGS. 5, 6, and 7, the structures of bistability portion 20B will initially resist this −X motion. After structures 44 of portion 20B buckle, portion 20B will exhibit reduced resistance to motion in the −X direction. When structures 44 of portion 20B reach their limit, resistance will again increase. The configuration of FIG. 20 therefor can provide both parallel motion and bistability in a structure with integral fabric portions.

If desired, button 20 may have a ring of fabric that serves as a supporting web. As shown in FIG. 21, button 20 may have a moving button member such as member 50 (e.g., a keycap labeled with an alphanumeric character) that is formed from rigid material (e.g., polymer, metal, and/or other materials). Biasing structure 44 may be formed from a rectangular ring of fabric that surrounds and supports button member 50 within support structure 46, as described in connection with FIG. 9. As shown in FIG. 22, when a user presses a finger or other object against the surface of member 50, the fabric of biasing structure 44 expands and translates, allowing member 50 to be depressed. When member 50 is released, biasing structure 44 serves as a spring that restores member 50 to its original undepressed position. As shown in the cross-sectional side view of FIG. 24, the structures of button 20 may have a dual layer configuration (e.g., with dual layers of fabric/structures 44) to help ensure that button member 50 exhibits parallel motion when depressed and released. The structures of button 20 of FIG. 23 may be coupled together and to supporting structures using fabric (e.g., portions of structures 44), elastomeric material, adhesive, foam, other flexible coupling structures, etc.

In the illustrative configuration of FIG. 24, button 20 has a spring formed from a rectangular ring of fabric. Button member 50 may be formed from a rigid member (e.g., polymer, metal, glass, other materials, combinations of these materials, etc.). Fabric for biasing structure 44 may form a rectangular ring with walls for supporting member 50 at a desired position above support structure 46. When depressed downward, button member 50 travels from undepressed position 50T to the position shown in FIG. 24. The springiness of the fabric of biasing structure 44 allows the fabric of FIG. 24 to serve as a spring for button 20 that restores button member 50 to position 50T when released.

In the example of FIG. 25, button 20 has an air bladder that serves as a button member biasing structure. As shown in FIG. 25, button member 50 may be configured to travel upwards and downwards along support structure 46 (e.g., using guide structures in support structures 46 such as protrusions on button member 50 that are mated with guiding rails in support structures 46, etc.). Fabric or other material (e.g., flexible polymer) may form an air bladder that serves as biasing structure 44 for button member 50. Opening 125 in the air bladder and/or openings in porous fabric bladder walls may allow air to escape from bladder interior 127 when button member 50 is pressed and the air bladder is compressed. When pressure is released from button member 50, air bladder will tend to restore itself to its original shape, drawing air back into interior 127. By tuning the size of opening 125 and the materials used to form the air bladder, the characteristics of button 20 may be adjusted (e.g., to provide a desired haptic response, to tune key return speed, to control button compressibility, etc.).

Buttons 20 such as the illustrative buttons of FIGS. 21, 22, 23, 24, and 25 may include switches, capacitive sensors, resistive sensors, and/or other sensors 18 for detecting movement of button member 50 and thereby detecting button press input from a user.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. A button, comprising:
a support structure;
a movable button structure; and
fabric-based biasing structures that are coupled between the movable button structure and the support structure and that include fabric configured to provide bistable force feedback to the movable button structure as the movable button structure is pressed and moves relative to the support structure.

2. The button defined in claim 1 wherein the fabric-based biasing structures comprise knit fabric, wherein the movable button structure has a periphery, wherein the fabric-based biasing structures surround the periphery and span a gap between the support structure and the movable button structure, and wherein the button comprises conductive sensor structures.

3. The button defined in claim 1 wherein the support structure comprises fabric.

4. The button defined in claim 1 wherein the movable button structure comprises fabric.

5. The button defined in claim 1 wherein movable button structure has peripheral edges and wherein the fabric-based biasing structure runs along at least two of the peripheral edges.

6. The button defined in claim 5 wherein the movable button structure has a rectangular periphery.

7. The button defined in claim 1 wherein the fabric-based biasing structures comprise knit fabric.

8. The button defined in claim 1, further comprising:
conductive structures, wherein the conductive structures comprise conductive strands of material in the fabric-based biasing structures.

9. The button defined in claim 1, further comprising:
conductive structures, wherein the support structure comprises fabric and wherein the conductive structures form part of the fabric.

10. The button defined in claim 1, further comprising:
conductive structures, wherein the movable button structure comprises fabric and wherein the conductive structures form part of the fabric.

11. The button defined in claim 1, wherein the movable button structure comprises fabric that forms a first capacitive sensor electrode, wherein the button support structure comprises fabric that forms a second capacitive sensor electrode, and wherein a capacitance between the first and second capacitive sensor electrodes changes when the button receives a button press input.

12. The button defined in claim 1, wherein a resistance in strands of material in the fabric-based biasing structures changes when the button receives a button press input.

13. The button defined in claim 1 wherein the fabric-based biasing structures allow motion of the movable button structure along a path that is parallel to a surface normal of the movable button structure.

14. The button defined in claim 13 wherein the fabric-based biasing structures comprise first and second hinges with first and second movable portions that move respectively along first and second axes that are orthogonal to each other when the movable button structure is depressed along the path that is parallel to the surface normal.

15. The button defined in claim 1 wherein the movable button structure comprises a first terminal, wherein the support structure comprises a second terminal, and wherein a resistance between the first and second terminals changes when the button receives a button press input.

16. The button defined in claim 1 further comprising a haptic actuator coupled to the movable button structure.

17. The button defined in claim 1 wherein the fabric-based biasing structures comprise:
a movable portion that configured to move along a direction as the movable button structure is pressed;
a first portion coupled between the movable portion and the movable button structure; and
a second portion coupled between the movable portion and the support structure, wherein the first and second portions each have strands of material that are angled at a non-zero angle with respect to the direction to promote movement of the movable portion along the direction as the movable button structure is pressed.

18. The button defined in claim 1 wherein the fabric-based biasing structures are configured to form an air bladder with an opening.

19. The button defined in claim 1 wherein the fabric-based biasing structures are configured to form a springy rectangular ring that supports the movable button structure.

20. The button defined in claim 1 wherein the fabric-based biasing structures contain multiple layers.

21. The button defined in claim 1 wherein the fabric-based biasing structures include optical fibers.

22. The button defined in claim 21 further comprising a light-emitting device that supplies light to the optical fibers to provide illumination for the movable button structure.

23. A button, comprising:
a button support structure;
a movable button structure; and
intertwined strands of material that form a bistable spring that is coupled between the movable button structure and the button support structure.

24. A fabric button, comprising:
a movable button structure formed of fabric;
a support structure formed of fabric; and
a bistable biasing structure formed from fabric that is coupled between the movable button member and the support structure and that allows motion of the movable button structure along a path that is parallel to a surface normal of the movable button structure.

25. An item, comprising:
a movable button member;
a support structure; and
fabric that serves as a biasing structure that allows the movable button member to move back and forth relative to the support structure between undepressed and depressed states.

* * * * *

UNITED STATES PATENT AND TRADEMARK OFFICE
CERTIFICATE OF CORRECTION

PATENT NO. : 10,983,600 B2
APPLICATION NO. : 16/539754
DATED : April 20, 2021
INVENTOR(S) : Paul X. Wang, Ian A. Guy and Karan Bir Page 1 of 1

It is certified that error appears in the above-identified patent and that said Letters Patent is hereby corrected as shown below:

In the Specification

Column 1, Line 63, "embodiment in accordance with an embodiment." should read -- embodiment. --

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*